(12) United States Patent
Dirks et al.

(10) Patent No.: US 7,546,560 B2
(45) Date of Patent: Jun. 9, 2009

(54) OPTIMIZATION OF FLIP FLOP INITIALIZATION STRUCTURES WITH RESPECT TO DESIGN SIZE AND DESIGN CLOSURE EFFORT FROM RTL TO NETLIST

(75) Inventors: Juergen Dirks, Holzkirchen (DE); Martin Fennell, Iverheath (GB); Iain Stickland, Eversley (GB)

(73) Assignee: LSI Corporation, Milpitas, CA (US)

( * ) Notice: Subject to any disclaimer, the term of this patent is extended or adjusted under 35 U.S.C. 154(b) by 243 days.

(21) Appl. No.: 11/634,683

(22) Filed: Dec. 6, 2006

(65) Prior Publication Data
US 2008/0141184 A1 Jun. 12, 2008

(51) Int. Cl.
*G06F 17/50* (2006.01)

(52) U.S. Cl. .................. 716/2; 716/3; 716/5; 716/7; 716/18

(58) Field of Classification Search .......... 716/2, 716/3, 5, 7, 18
See application file for complete search history.

(56) References Cited

U.S. PATENT DOCUMENTS

| | | | |
|---|---|---|---|
| 5,659,775 A * | 8/1997 | Stein et al. ............. | 716/3 |
| 6,081,656 A * | 6/2000 | Witt ..................... | 716/3 |
| 6,216,256 B1 * | 4/2001 | Inoue et al. ............. | 716/6 |
| 6,321,184 B1 * | 11/2001 | Baumgartner et al. ...... | 703/15 |
| 6,330,703 B1 * | 12/2001 | Saito et al. ............. | 716/4 |
| 6,922,818 B2 * | 7/2005 | Chu et al. .............. | 716/2 |
| 6,988,254 B2 * | 1/2006 | Iwanishi et al. .......... | 716/6 |
| 7,028,273 B2 * | 4/2006 | Kanamaru et al. ........ | 716/2 |
| 7,254,793 B2 * | 8/2007 | Chen et al. ............. | 716/5 |
| 7,480,877 B2 * | 1/2009 | Acuna et al. ............ | 716/4 |
| 2003/0149943 A1 * | 8/2003 | Yoshikawa .............. | 716/1 |
| 2003/0182641 A1 * | 9/2003 | Yang .................... | 716/4 |
| 2004/0015789 A1 * | 1/2004 | Kanamaru et al. ........ | 716/1 |
| 2004/0015790 A1 * | 1/2004 | Cunningham et al. ...... | 716/3 |
| 2006/0190870 A1 * | 8/2006 | Chen et al. ............. | 716/5 |
| 2008/0040694 A1 * | 2/2008 | Acuna et al. ............ | 716/4 |
| 2008/0127003 A1 * | 5/2008 | Nieh et al. .............. | 716/3 |

FOREIGN PATENT DOCUMENTS

| EP | 549130 A2 * | 6/1993 |
|---|---|---|
| JP | 2005293493 A * | 10/2005 |

OTHER PUBLICATIONS

Hirano et al., Automated English translation of Japanese Patent Document No. JP-2005293493 A, translated on Sep. 28, 2008.*

(Continued)

*Primary Examiner*—Phallaka Kik
(74) *Attorney, Agent, or Firm*—Christopher P. Maiorana, PC

(57) ABSTRACT

A method for optimizing a design of a circuit is disclosed. The method generally includes the steps of (A) identifying a plurality of first flip flops in the design and (B) replacing each of the first flip flops in a file of the design that do not have to be initialized during operations of the circuit with a respective second flip flop without an initialization capability.

22 Claims, 5 Drawing Sheets

OTHER PUBLICATIONS

O'Connor, "A Methodology for Programmable Logic Migration to ASICs Including Automatic Scan Chain Insertion and ATPG", Fourth Annual IEEE International ASIC Conference and Exhibit, Sep. 23-27, 1991, pp. p. 2-1/1-4.*

Qadeer et al., "Latch Redundancy Removal Without Global Reset", Proceedings of IEEE International Conference on Computer Design: VLSI in Computers and Processors, Oct. 7-9, 1996, pp. 432-439.*

Wu et a., "Storage Optimization by Replacing Some Flip-Flops with Latches", Proceedings of EURO-DAC, European Design Automation Conference, Sep. 16-20, 1996, pp. 296-301.*

Yoshikawa et al., "Timing Optimization by Replacing Flip-Flops to Latches", Proceedings of the ASP-DAC 2004 Design Automation Conference, Jan. 27-30, 2004, pp. 186-191.*

* cited by examiner

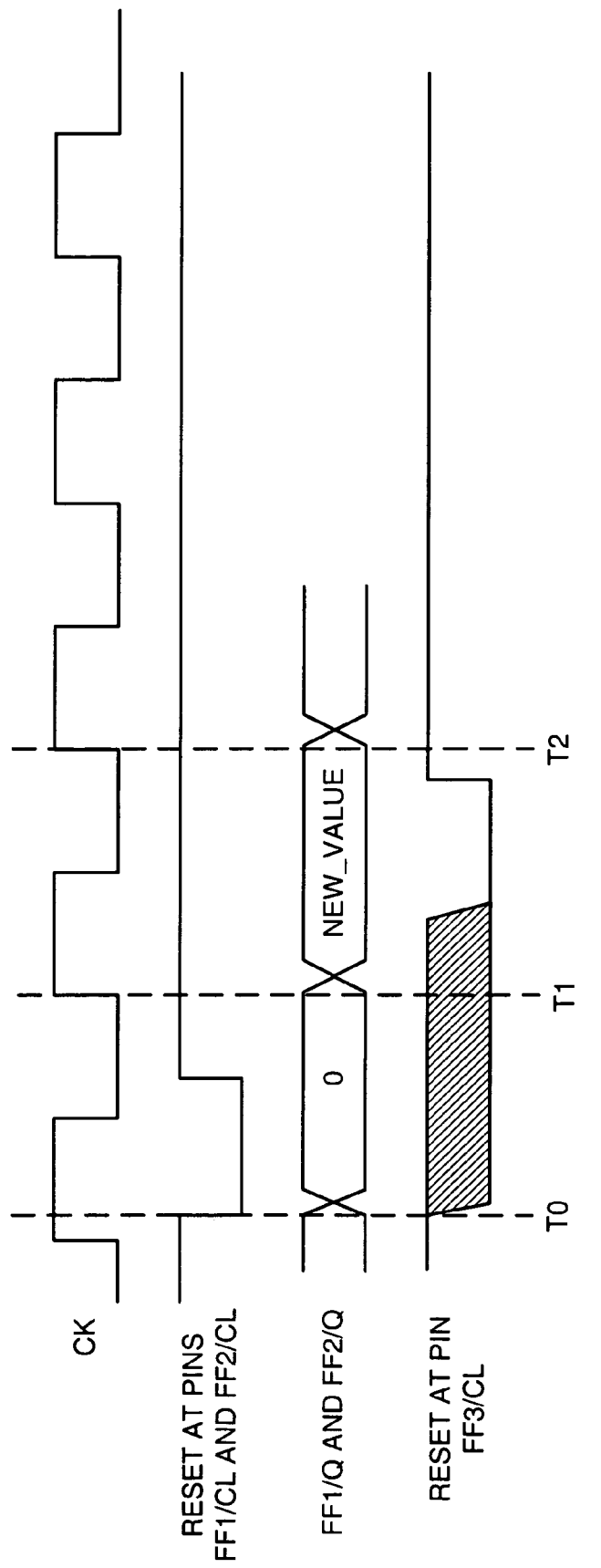

US 7,546,560 B2

OPTIMIZATION OF FLIP FLOP INITIALIZATION STRUCTURES WITH RESPECT TO DESIGN SIZE AND DESIGN CLOSURE EFFORT FROM RTL TO NETLIST

FIELD OF THE INVENTION

The present invention relates to electronic circuit designs generally and, more particularly, to an optimization of flip flop initialization structures with respect to design size and design closure effort from register transfer language (RTL) to netlist.

BACKGROUND OF THE INVENTION

Different reasons motivate chip developers to use certain initialization mechanisms (i.e., asynchronous reset or set, or synchronous reset or set) for the flip flops in circuit designs. The reasons vary from easing simulation work to hard criteria for parts of the circuit to start in defined states after power up in the system. In some cases, legacy code from other designs is reused where initialization structures are already in the design.

In most designs, a particular initialization strategy is determined for implementation across an entire chip. After splitting the work between different developers and bringing the pieces back together at the end, no further checks are performed to determine whether the particular initialization scheme was implemented as planned in all parts of the design. In particular, no optimization of the initialization circuit is performed. The above approach happens more frequently in cases where legacy code is used from earlier designs.

Because of a growing number of flip flops in high complex multimillion gates designs, a tremendous overhead is commonly introduced by (i) choosing such overall schemes for initialization and (ii) poor optimization. The overhead is caused by different effects:

A) Flip flops that are used to implement an asynchronous reset commonly have a larger size than flip flops without reset. In cases where logic gates are used to implement the initialization circuitry, the gate count due to the asynchronous reset structures is larger than without the asynchronous reset structures.

B) Many extra cells are inserted and built into a tree, such as a reset net or similar structure, to reach all endpoints relevant for the initialization.

C) Because of a high fanout nature, the initialization nets often become a limiting factor for timing closure. As such, even more gates are used to parallelize logic to close the timing.

SUMMARY OF THE INVENTION

The present invention concerns a method for optimizing a design of a circuit. The method generally comprises the steps of (A) identifying a plurality of first flip flops in the design and (B) replacing each of the first flip flops in a file of the design that do not have to be initialized during operations of the circuit with a respective second flip flop without an initialization capability.

The objects, features and advantages of the present invention include providing an optimization of flip flop initialization structures with respect to design size and design closure effort from register transfer language (RTL) to netlist that may (i) optimize initialization structures of a design with regards to gate count, (ii) optimize initialization structures of a design with regards to nets to be routed, (iii) reduce an area for a design implementation compared with conventional implementations, (iv) reduce a die size for the design implementation, (v) reduce a cost, (vi) reduce a number of objects in a design database to be handled by physical design tools, (vii) reduce the amount of logic for the physical design tool to work, (viii) make overall design timing easier, (ix) permit easier routing closure, (x) reduce run times and/or (xi) reduce turnaround times compared with conventional circuit design techniques.

BRIEF DESCRIPTION OF THE DRAWINGS

These and other objects, features and advantages of the present invention will be apparent from the following detailed description and the appended claims and drawings in which:

FIG. 5 is a timing diagram corresponding to the example circuit design.

DETAILED DESCRIPTION OF THE PREFERRED EMBODIMENTS

The present invention generally optimizes reset and set structures of an electronics circuit design to minimize an overhead in gatecount and nets to route. The present invention may also ease timing closure work for physical optimization tools. Flip flops that may be connected to one or more logic nets providing initialization values (e.g., asynchronous reset, synchronous reset, asynchronous set, synchronous set) are generally analyzed and then checked for mandatory initialization/non-initialization in a context of the design. All flip flops that do not have to be initialized may be changed automatically (e.g., replaced by simpler flip flops). As a result, the design may be (i) optimized for gate count and nets to route and (ii) simplified for physical design tools.

The circuit design may be entered in any format as a starting point, such as a register transfer language (RTL) or a gate level netlist. A tool generally writes the changed design into a file using the same format as the starting format or in another format as requested by a user. The analysis of whether the flip flops have to be initialized or not may be based on a set of rules. The rules may be modified by the user.

Figure 1:
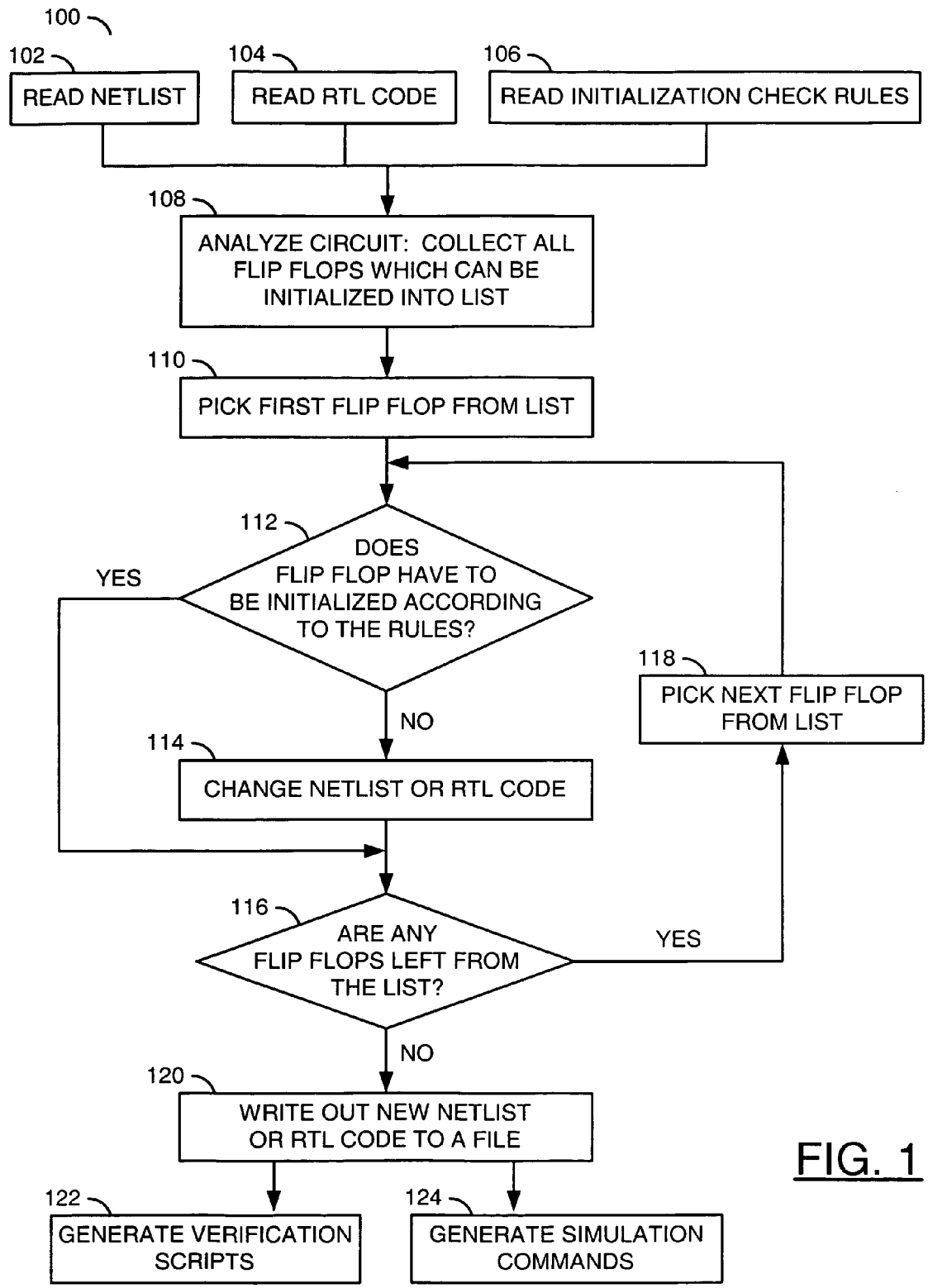
FIG. 1 is a flow diagram of method in accordance with a preferred embodiment of the present invention.

Referring to FIG. 1, a flow diagram of method 100 is shown in accordance with a preferred embodiment of the present invention. The method (or process) 100 may be implemented as an optimization tool for initialization structures. The method 100 generally comprises a step (or block) 102, a step (or block) 104, a step (or block) 106, a step (or block) 108, a step (or block) 110, a step (or block) 112, a step (or block) 114, a step (or block) 116, a step (or block) 118, a step (or block) 120, a step (or block) 122 and a step (or block) 124.

The starting format for the optimization may vary from RTL code to gate level netlist descriptions. In the step 102, a netlist of the circuit may be read from a database (or file). Alternatively, an RTL code of the circuit may be read from the database (or file) in the step 104. Other circuit design formats may be implemented to meet the criteria of a particular application. In the step 106, the method 100 may read a set of initialization check rules from the database (or file).

An analysis of the design (e.g., netlist or RTL code) of the circuit may be performed in the step 108. In the analysis, the method 100 generally analyzes one or more reset and set structures of the design to find all of the flip flops that may be described as resetable and/or setable. The setable characteristic and/or resetable characteristic may be synchronously and/or asynchronously. Each flip flop found to have an initialization (e.g., setable or resetable) characteristic may be added to a list.

In the step 110, a first of the flip flops found in the step 108 may be read from the list. A check may be performed in the step 112 for the flip flop read from the list. The check generally determines whether the flip flop has to be initialized or does not have to be initialized during operation of the circuit according to the initialization check rules. The initialization check rules generally comprise a predefined set of rules that are fulfilled if the flip flop has to be initialized. For example, flip flops that are part of a state machine may be marked as having to be initialized.

In addition to the predefined rules, a user of the method 100 may be able to add specific rules. The added rules are generally design dependent. For example, certain flip flops may have to be resetable in order to save power. Further examples of the rules generally include, but are not limited to, (i) flip flops that directly drive chip level outputs without feeding back into the chip generally do not have to be initialized and (ii) flip flops that do not feed back to themselves, except via initialized registers, do not have to be initialized.

If the flip flop is determined to have to be initialize (e.g., the YES branch of step 112), the method 100 generally continues with step 116. If the flip flop is determined not to have to be initialize (e.g., the NO branch of step 112), the method 100 may continue with step 114. In the step 114, the method 100 may change the design of the circuit for the flip flop that (i) could be initialized (e.g., found by step 108) and (ii) where initialization is not mandatory (e.g., per step 112). The change generally includes (i) replacing the flip flop with a simpler flip flop lacking the unused initialization capability and (ii) removing the circuitry from the reset and set structures that previously connected to the flip flop. The change may be performed in RTL code and/or a gate level netlist description, depending on the input to the method 100.

In a step 116, the list may be checked for more flip flops that have not been considered according to the initialization check rules. If the list contains more unchecked flip flops (e.g., the YES branch of step 116), a next flip flop may be read from the list in the step 118. The method 100 then repeats the comparison of the just-read flip flop to the rules (step 112) and may either change the design (step 114) or maintain the design (bypass step 114).

After processing all of the flip flops in the list (e.g., the NO branch of step 116), the changed design is generally written by the method 100 to a file in the step 120. An example initial RTL code of a flip flop may be presented as follows:

```
always@(posedge clk or negedge reset_n)
    begin
        if (reset_n==1'b0)
            flop_value <= 1'b0;
        else
            flop_value <= new_value;
        end
    end
```

After processing by the method 100, the example RTL code may become:

```
always@(posedge clk)
    begin
        flop_value <= new_value;
    end
```

Changing a number of resetable and/or setable flip flops to non-resetable and non-setable flip flops broadly presents a functional change to the design. As such, a formal verification of the changed design may be performed with standard design verification tools available on the market. In support of the verification, the method 100 may automatically generate commands (or scripts) in the step 122 to account for the changes. Therefore, the design change may become transparent to the user and the original golden design may be used as a reference for comparisons through the design flow.

Generation of the verification commands generally involves adding a line to a verification script for each of the flip flops that has been changed from the resetable type and/or the setable type to a non-initializable type. Each of the lines may contain one or more commands in a language understood by formal verification tools available on the market. The lines generally define that all pins, nets and/or cells related to initialization of the flip flops should not be checked when comparing the original netlist against the new netlist.

Changing the flip flops from a first type that may be initialized to a second type that may not be initialized generally leads to changes for a design simulation. For example, a circuit design in which all flip flops may be initialized to a known state may start (i) processing data and (ii) comparing the data at the chip boundaries to expected values as soon as the simulation begins. Changing the design to include uninitializable flip flops may cause a delay of several clock cycles until valid values are stored into the chip boundary flip flops. Therefore, a simulation of the altered design may not start data processing and data comparison at the chip boundary until an appropriate delay after the simulation begins.

In order to get the same simulation behavior between the original design and the changed design, the method 100 may generate commands relative to the changed flip flops in the step 124. The commands generally allow the simulators to force the contents of the changed flip flop to the original initialization value. For each flip flop that could potentially be changed from the original resetable type and/or setable type to the non-initializable type, a line may be added to a simulator command file. Each of the lines generally contains one or more commands in a language understood by simulation tools available on the market. The lines may force the contents of the changed flip flops to certain initialization values, either at the beginning of the simulation or at any time when initialization signals previously connected to the initialization structures of the flip flops are asserted. The contents may be forced to a logical zero (e.g., VSS) for the flip flops that were resetable in the original netlist and forced to a logical one (e.g., VDD) for the flip flops that were setable in the original netlist. Simulators currently available on the market generally allow such value forcing in flip flops. Therefore, the simulation behavior may remain the same before and after the change to the initialization operations.

Figure 2:
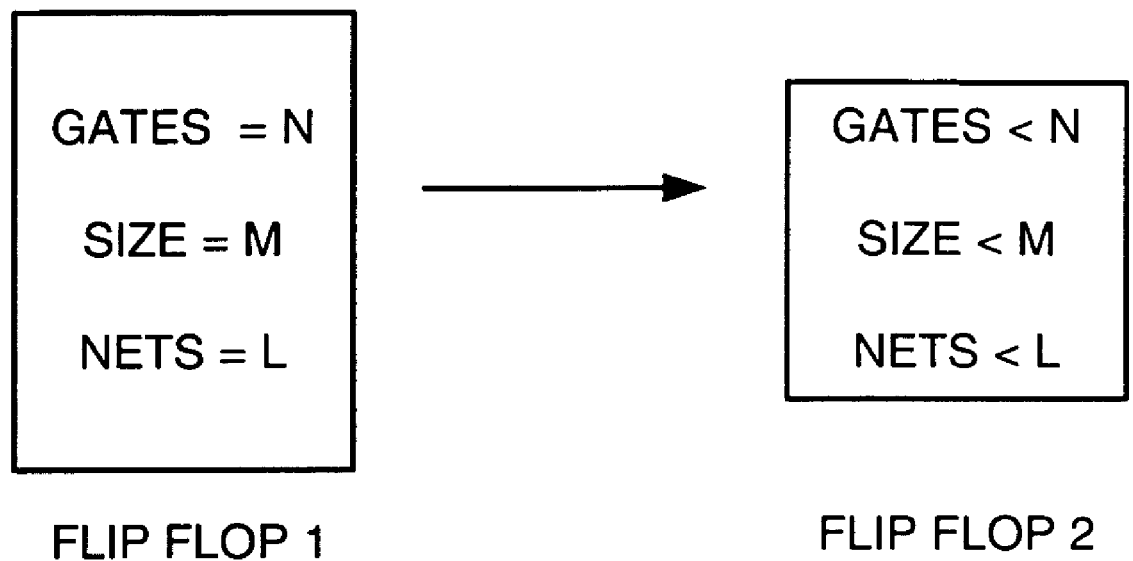
FIG. 2 is a block diagram of an example layout of a set of flip flops.

Referring to FIG. 2, a block diagram of an example layout of a set of flip flops is shown. An original flip flop 140 may have a set capability and/or a reset capability. A design for the flip flop 140 may include N gates, occupy a size of M, and have L nets to be routed. After processing by the method 100, the original flip flop 140 may be replaced in the design by a simpler flip flop 142. The simpler flip flop 142 generally has fewer than N gates, occupies less area than M and may have fewer than L nets to route.

Figure 3:
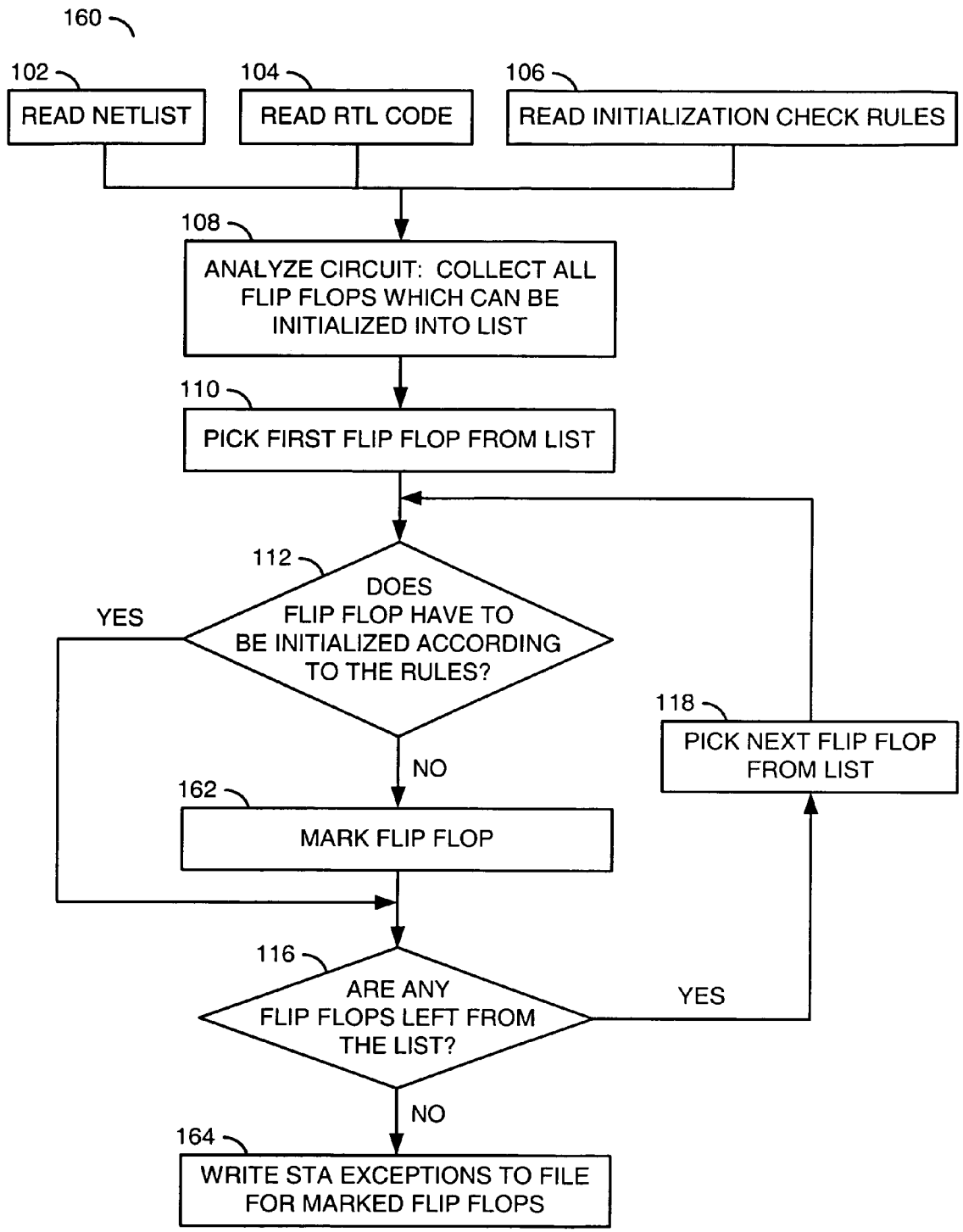
FIG. 3 is a flow diagram of an example method for supporting a static timing analysis.

Referring to FIG. 3, a flow diagram of an example method 160 for supporting a static timing analysis (STA) is shown. The method (or process) 160 may be implemented as an STA constraint generation tool. The method 160 generally comprises the step 102, the step 104, the step 106, the step 108, the step 110, the step 112, the step 116, the step 118, a step (or block) 162 and a step (or block) 164. The method 160 generally parallels the method 100, except the circuit design may remain unaltered (e.g., no step 114).

In a case where the user does not want the circuit design to be changed, the analysis of the flip flops may still be used to create a special set of STA constraints. The constraints may indicate that the flip flops that do not have to be initialized generally do not have to meet the tightest setup and hold time targets of the design. The timing paths to the set and/or reset structures of such flip flops may have relaxed constraints. The method 160 may flow through the steps 102 to 112 and steps 116 to 118 to identify all of the flip flops do have to be initialized. Instead of modifying the design to replace certain flip flops, the method 160 may mark the flip flops instead in the step 162.

All of the marked flip flops may exit a circuit initialization operation one or more clock cycles earlier or later compared with the flip flops that have to be forced into an initial state at a specific point in time. Therefore, timing closures may not be performed for the reset nets and/or set nets going to the marked flip flops. As such, exceptions (e.g., multi cycle paths or false paths) may be defined for static timing analysis of all initialization related pins and/or timing arcs of the flip flops that do not have to be initialized according to the analysis.

Figure 4:
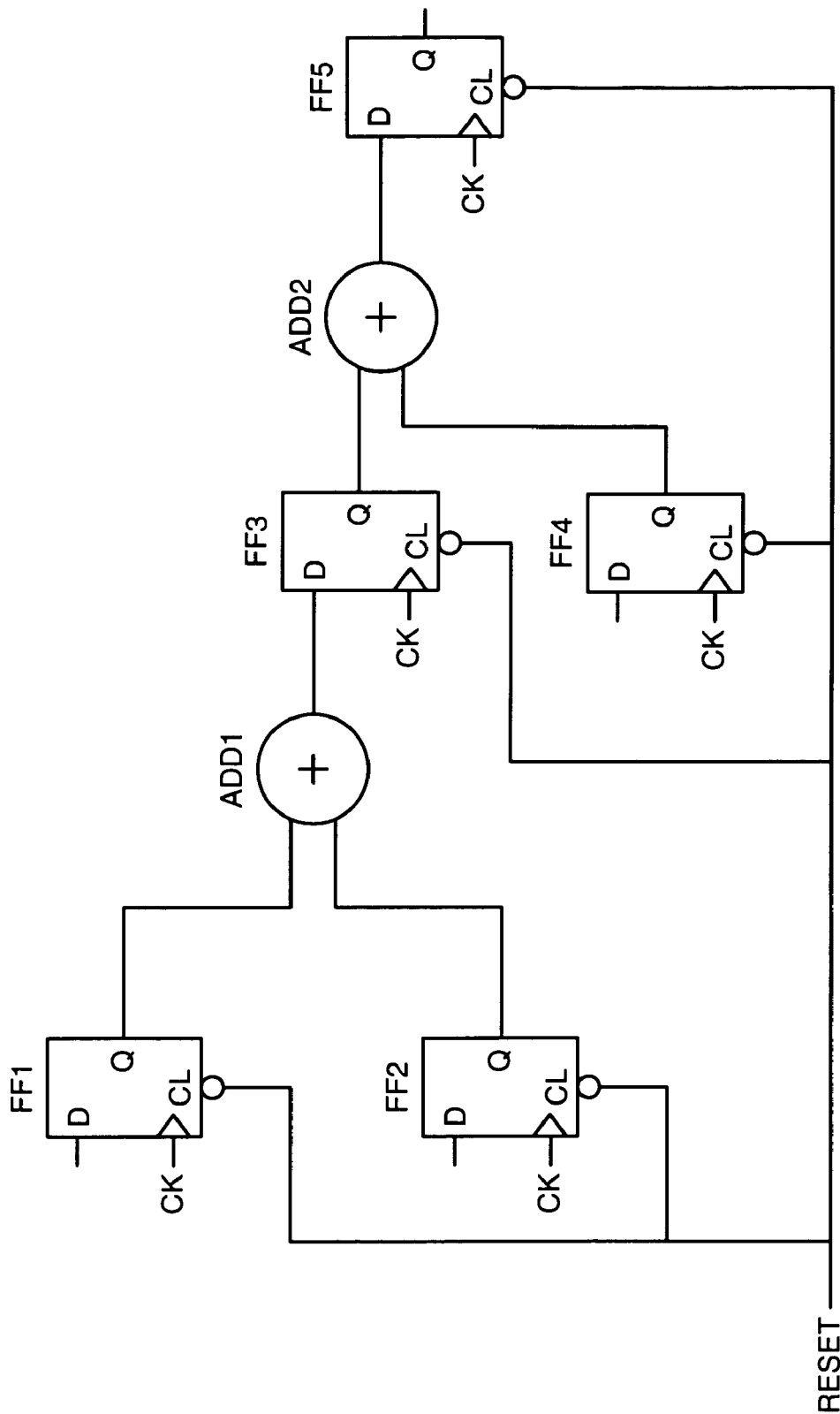
FIG. 4 is a block diagram of an example circuit design for explaining a timing closure.

Referring to FIG. 4, a block diagram of an example circuit design 180 for explaining a timing closure is shown. The example circuit design 180 generally comprises a circuit (or module) FF1, a circuit (or module) FF2, a circuit (or module) FF3, a circuit (or module) FF4, a circuit (or module) FF5, a circuit (or module) ADD1 and a circuit (or module) ADD2. The circuit design 180 may implement part of a pipeline stage in an arithmetic data processing unit. Each of the circuits FF1 through FF5 may be implemented as a D-flip flop. Each of the circuits ADD1 and ADD2 may be implemented as an adder. A clock signal (e.g., CK) may be received at a clock input of each circuit FF1 through FF5. A signal (e.g., RESET) may be received at a reset pin (e.g., CL) of each of the circuits FF1 through FF5. Assertion of the signal RESET may be active low (e.g., VSS).

Referring to FIG. 5, a timing diagram corresponding to the circuit design 180 is shown. At a beginning of a simulation and/or assertion of the signal RESET (e.g., time T0) the contents of the circuit FF1 and the circuit FF2 may by forced into a known state (e.g., Q=a logical zero). The circuit FF3 generally receives a valid value (e.g., NEW_VALUE) at the start of the next clock cycle (e.g., time T1) after the reset of the circuit FF1 and the circuit FF2 has ended. Therefore, the signal RESET at the pin CL of the circuit FF3 does not have to be deasserted until (i) after the time T1 and (ii) before a start of the next clock cycle (e.g., time T2). Compared with the deassertion of the signal RESET at the circuit FF1 and the circuit FF2, the deassertion of the signal RESET may experience a propagation delay to the circuit FF3 of up to a complete clock cycle. As such, a timing exception (e.g., a multi cycle path definition) specified for the signal RESET to the pin CL of the circuit FF3 may be generated by the method 160 in the step 164 (FIG. 3).

Generally, a line may be written into a static timing analysis exceptions file for each of the flip flops that could potentially be changed from the original resetable type and/or setable type to the non-initializable type. Each of the lines may contain one or more commands in a language understood by static timing analysis tools available on the market. The lines generally define false paths and/or multi cycle paths to all of the pins and/or timing arcs related to initialization of the flip flops.

The method 100 and the method 160 may each be implemented as a software program stored on a media and executable on a computer. Products of the methods 100 and 106 may include files on storage media. The products of the method 100 generally include an altered design, a set of commands/scripts for verification and/or a set of commands for modifying a simulation to account for the circuit design changes caused by the method 100. The products of the method 160 generally include a file indicating which flip flops could be changed to be non-resettable/non-setable and a file of STA exceptions.

The function performed by the flow diagrams of FIGS. 1 and 3 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMS, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:

1. A method for optimizing a design of a circuit, comprising steps of:
   (A) identifying a plurality of first flip flops in a first version of said design using a computer program;
   (B) creating a second version of said design by replacing each of said first flip flops in a file of said design that do not have to be initialized during operations of said circuit with a respective second flip flop without an initialization capability; and
   (C) generating a plurality of commands suitable to use in a verification tool, said verification tool being configured to perform a comparison of said first version of said design against said second version of said design, and said commands instructing said verification tool to ignore one or more nets related to initialization of said first flip flops that have been replaced by said second flip flops in said comparison.

2. The method according to claim 1, further comprising a step of:

comparing said first flip flops against a plurality of rules to determined which of said first flip flops do not have to be initialized during said operations.

3. The method according to claim 1, further comprising a step of:

removing from said file of said design a respective initialization circuit for each of said first flip flops replaced by said respective second flip flops.

4. The method according to claim 1, wherein said design comprises a netlist for said circuit.

5. The method according to claim 1, wherein said design comprises a register transfer language code for said circuit.

6. The method according to claim 1, wherein said respective second flip flops have (i) a smaller physical area, (ii) a lower gate count and (iii) fewer nets to route than said first flip flops.

7. The method according to claim 1, for implementing a storage medium storing said computer program comprising the steps of claim 1.

8. The method according to claim 1, further comprising a step of:

generating a respective command to initialize said respective second flip flops in a simulation.

9. The method according to claim 1, further comprising a step of:

marking each of said second flip flops of said design with a respective static timing analysis constraint.

10. A method for optimizing a design of a circuit, comprising steps of:

(A) analyzing a first version of said design to create a set of first flip flops that have an initialization capability using a computer program;

(B) eliminating from said set each of said first flip flops that has to be initialized;

(C) creating a second version of said design by modifying a file of said design to replace each of said first flip flops remaining in said set with a respective second flip flop that lacks said initialization capability; and (D) generating a plurality of commands suitable to use in a simulation tool, said simulation tool being configured to perform a simulation of said second version of said design, said commands instructing said simulation tool how and when to force each of said second flip flops to a respective one of a plurality of initial values during said simulation, and said initial values matching a plurality of initialization conditions of said first flip flops that were replaced in said first design.

11. The method according to claim 10, wherein step (B) comprises a sub-step of:

comparing said first flip flops against a plurality of rules to determine which of said first flip flops have to be initialized.

12. The method according to claim 11, wherein said comparing of said first flip flops against said rules is performed sequentially, one of said first flip flops at a time.

13. The method according to claim 11, further comprising a step of:

maintaining said first flip flops in said file that have to be initialized according to said rules.

14. The method according to claim 10, further comprising a step of:

generating a plurality of scripts for verifying said design after modification with said respective second flip flops.

15. The method according to claim 10, further comprising a step of:

removing from said file a respective initialization circuit for each of said first flip flops replaced by said respective second flip flops.

16. The method according to claim 10, for implementing a storage medium storing said computer program comprising the steps of claim 10.

17. The method according to claim 10, further comprising a step of:

marking each of said second flip flops of said design with a respective static timing analysis constraint.

18. A method for optimizing a design of a circuit, comprising steps of:

(A) generating a list of one or more flip flops in said design having an initialization capability using a computer program;

(B) eliminating from said list each of said flip flops that have to be initialized; and (C) marking in a file a respective static timing analysis constraint for each of said flip flops remaining in said list.

19. The method according to claim 18, wherein said respective static timing analysis constraints exempt said flip flops in said list from a timing closure analysis.

20. The method according to claim 18, wherein step (B) comprises a sub-step of:

comparing said flip flops against a plurality of rules to determined which of said flip flops do not have to be initialized during operations of said circuit.

21. The method according to claim 20, wherein said rules are variable by a user.

22. The method according to claim 18, for implementing a storage medium storing said computer program comprising the steps of claim 18.

* * * * *